United States Patent [19]
Blakeslee

[11] Patent Number: 4,884,020
[45] Date of Patent: Nov. 28, 1989

[54] PHASE DETECTION SYSTEM

[75] Inventor: Thomas R. Blakeslee, Woodside, Calif.

[73] Assignee: Orion Instruments, Inc., Redwood City, Calif.

[21] Appl. No.: 222,943

[22] Filed: Jul. 22, 1988

[51] Int. Cl.⁴ ............................................. G01R 25/00
[52] U.S. Cl. ................................. 324/83 D; 328/133; 324/78 D; 307/516
[58] Field of Search ................. 324/77 R, 77 A, 77 E, 324/78 R, 78 D, 79 R, 79 D, 83 R, 83 D, 83 A; 328/133, 155; 307/516, 527; 331/1 A, 17, 34; 358/17, 18

[56] References Cited

U.S. PATENT DOCUMENTS

| | | | |
|---|---|---|---|
| 3,984,815 | 10/1976 | Drexler | 377/20 |
| 4,218,752 | 8/1980 | Hewes | 333/165 |
| 4,400,667 | 8/1983 | Belkin | 331/34 |
| 4,422,176 | 12/1983 | Summers | 307/516 |
| 4,717,950 | 1/1988 | Wesolowski | 358/18 |
| 4,754,216 | 6/1988 | Wong | 324/78 D |

Primary Examiner—Michael J. Tokar

[57] ABSTRACT

A method for determining the relative phase angle between a known reference and a signal under test includes the steps of providing a reference signal to a multi-tap delay line, where the number of taps is at least equal to the number of phases into which the signal under test is to be resolved, and then clocking a parallel shift register by the signal under test to capture the value of the delay line taps.

2 Claims, 3 Drawing Sheets

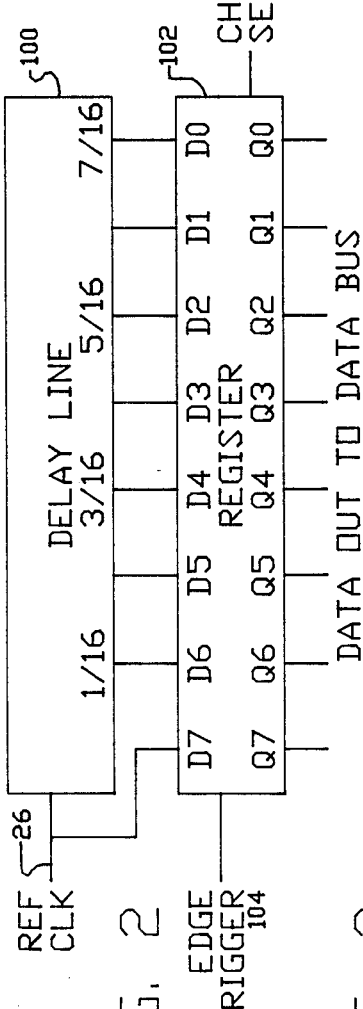

PHASE DETECTION SYSTEM

FIELD OF THE INVENTION

The present invention relates to time-based signal analysis systems and relates particularly to phase detection apparatus such as might be used in digital storage oscilloscopes or logic analyzers.

BACKGROUND OF THE INVENTION

Digital oscilloscopes, and particularly digital storage oscilloscopes, and logic analyzers frequently are used to measure relative characteristics between a fixed reference signal and another signal which varies over time relative to the reference. Many of these variable signals are repetitive, in which case a variety of techniques can be used to determine relative characteristics.

One technique frequently used for reconstructing repetitive waveforms is referred to as random-repetitive sampling. In random repetitive sampling, the digitizing clock provides a reference signal, and the waveform is reconstructed by taking samples of the waveform randomly over time. The time between the trigger and each random sample is measured, and eventually enough random samples are obtained that the entire waveform can be reconstructed simply by displaying all of the samples with the phase relationship intact relative to the reference.

In the past, measurement of phase angle between the reference and the signal under analysis has used complicated and sensitive circuitry. One such circuit, used by Tektronix in its Model 2430, involves the use of two dual-slope integrators and counters. One integrator and counter is used for each half of the clock signal.

The difficulty with such circuits is that they are complicated and have critical adjustments. For example, see the description of the Tektronix circuit noted above as described at page 3-54 of the Service Manual for that unit. As a result, there has been a need for a simple, reliable circuit for detecting phase angle in the environment of digital oscilloscopes, and particularly digital storage oscilloscopes.

SUMMARY OF THE INVENTION

The present invention provides just such a simple, reliable system for determining phase angle between a reference and another signal undergoing analysis. Uses for the invention extend beyond digital storage oscilloscopes and logic analyzers, and include virtually any type of equipment in which simple, accurate measurement of phase angle is desired.

The invention comprises a parallel input register and a tapped delay line driven by the reference clock. The tapped delay line has n/2 taps where n is the number of phases into which a single cycle will be divided. For a register of eight bits, such as a 74F374, sixteen phases can be obtained; for a register of sixteen bits, such as a 74F674, thirty-two phases can be obtained. Stated generally, a register of n/2 bits will resolve to n phases.

When the register is clocked, it captures the values of the signal outputs at the delay line taps. The original waveform can then be reconstructed from the phase detection information and the signal value information.

When used in connection with digital storage oscilloscopes, it is also important to ensure that the first and last phases are accurately detected. That is, the point at which the cycle repeats is critical. If the boundary between the latest phase from one clock and the earliest phase from the next clock is not correctly placed, the samples will be plotted one clock period from their correct location and significant distortions will result.

To provide such assurance, a simple flip-flop may be provided. The flip-flop is configured to be set during the early phases of the waveform under examination, and then reset thereafter. If the sample is then detected as falling in either the first or last phases, the state of the flip-flop may be examined to decide whether the sample should be plotted as the first or last phase.

It is therefore one object of the present invention to provide a simple but reliable method and apparatus by which phase angle between a reference and a second signal may be determined.

It is another object of the present invention to provide a method for determining phase angle using a tapped delay line.

It is yet another object of the present invention to provide a method and apparatus for recognizing the first and last phases of a repetitive waveform capable of being digitally reconstructed.

These and other objects of the present invention may be better understood from the following Detailed Description of the Invention, wherein FIG. 1 is a schematic block diagram of the system including the present invention, FIG. 2 shows an implementation of the tapped delay line portion of the present invention, FIG. 3 shows the waveforms associated with the tapped delay line configuration of FIG. 2, and FIG. 4 shows in simplified schematic form the present invention including means for determining whether a sample is from the first or last phases of a waveform.

FIG. 5 is a timing diagram of the operation of the circuit shown in FIG. 4.

DETAILED DESCRIPTION OF THE INVENTION

Figure 1:
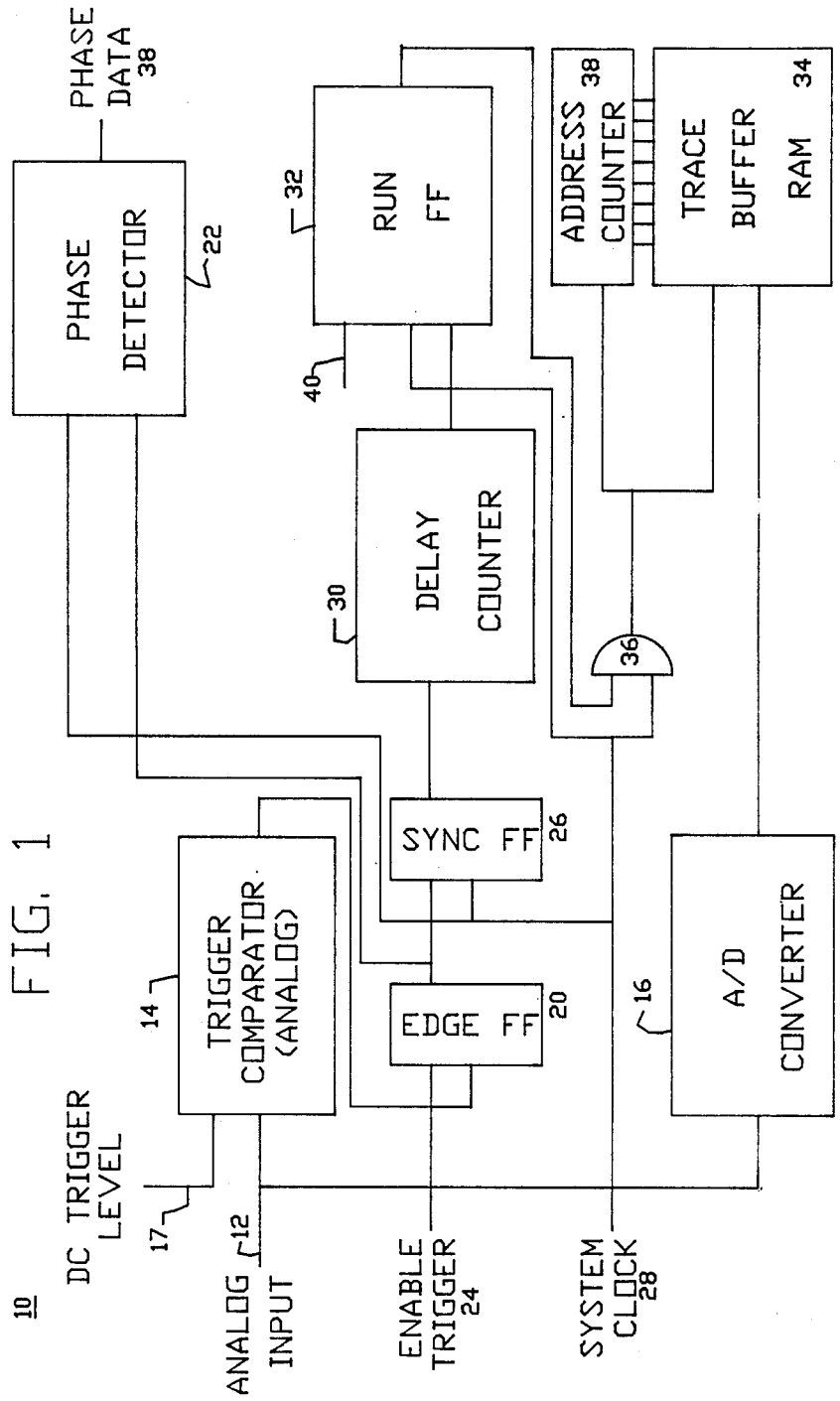

Referring first to FIG. 1, a system 10 which includes the present invention may be better understood. While such a system will frequently be a digital storage oscilloscope or logic analyzer, numerous aspects of the present invention may be used by less sophisticated types of electrical test equipment which need simply to determine relative phase angle between a reference and a signal under test.

The system 10 receives an analog input 12, which is the signal under test, and provides it to a trigger comparator 14 as well as an A/D converter 16. The trigger comparator 14 compares the analog input to the desired DC trigger voltage level 18, and in turn provides an output transition which sets the edge flip-flop 20 and strobes the phase detector 22 of the present invention on a clock line, as will be more clearly explained in connection with FIGS. 2 and 4, hereinafter.

The EDGE flip-flop 20, which is typically a JK type, receives an enable trigger signal 24 on its J input. The positive output of the EDGE flip-flop 20 also is provided to the J input of a SYNC flip-flop 26, which is clocked by the system clock 28. The SYNC flip-flop 26, also typically a JK type, provides the enable input to a delay counter 30. The system clock 28 clocks the delay counter 30 and also supplies the input to a delay line portion of the phase detector 22, again as will be more completely understood in connection with FIGS. 2 and 4 hereinafter.

The delay counter 30 counts out the desired number of post-trigger samples, then resets the Run flip-flop 32, which in turn gates off the clocks to a trace buffer RAM 34 to stop the acquisition cycle. The trace buffer RAM 34 receives its data input from the A/D converter 16.

The RUN flip-flop 32 gates the trace buffer RAM through a two input AND gate 36, the remaining input to which is supplied by the system clock 28. The output of the AND gate 36 also provides a clock input to an address counter 38, which provides addressing data to the trace buffer RAM 34. The RUN flip-flop 32 begins operation upon receiving a start signal 40 on its J input.

The phase detector 22, discussed in greater detail hereinafter, provides its output on phase data lines 42, where it may be used in a conventional manner by the remainder of the system.

Referring now to FIG. 2, the phase detector of the present invention may be better appreciated. The phase detector 22 of FIG. 1 comprises a tapped delay line 100 and a register 102. Each tap of the tapped delay line 20 represents 1/n of the period of the reference clock, with the reference clock being divided to n phases. The reference clock signal 26 provides the clocking signal to the delay line, and also provides the most significant data input (D7) to the register 102. An edge trigger signal clocks the register 102, which captures the values of the signal outputs at the taps of the delay line 100.

In a digital oscilloscope or similar device using equivalent time sampling, the sampling interval is subdivided into n phases and samples are plotted one phase for each capture cycle. The phase detector determines which subdivision of the sampling interval the current samples belong in by measuring the relative phase of the trigger signal with respect to the clock of the oscilloscope. As noted previously, the signal trigger is random relative to the oscilloscope clock, so that eventually all phases will be sampled and the waveform can be reconstructed.

With reference now to FIG. 3, the sixteen possible phases for an eight bit register 102 are shown. One example of a suitable eight bit register is a 74F374. If higher resolution is desired, 32 phases may be obtained through use of a 74F674 and a comparable delay line 100.

Figure 4:
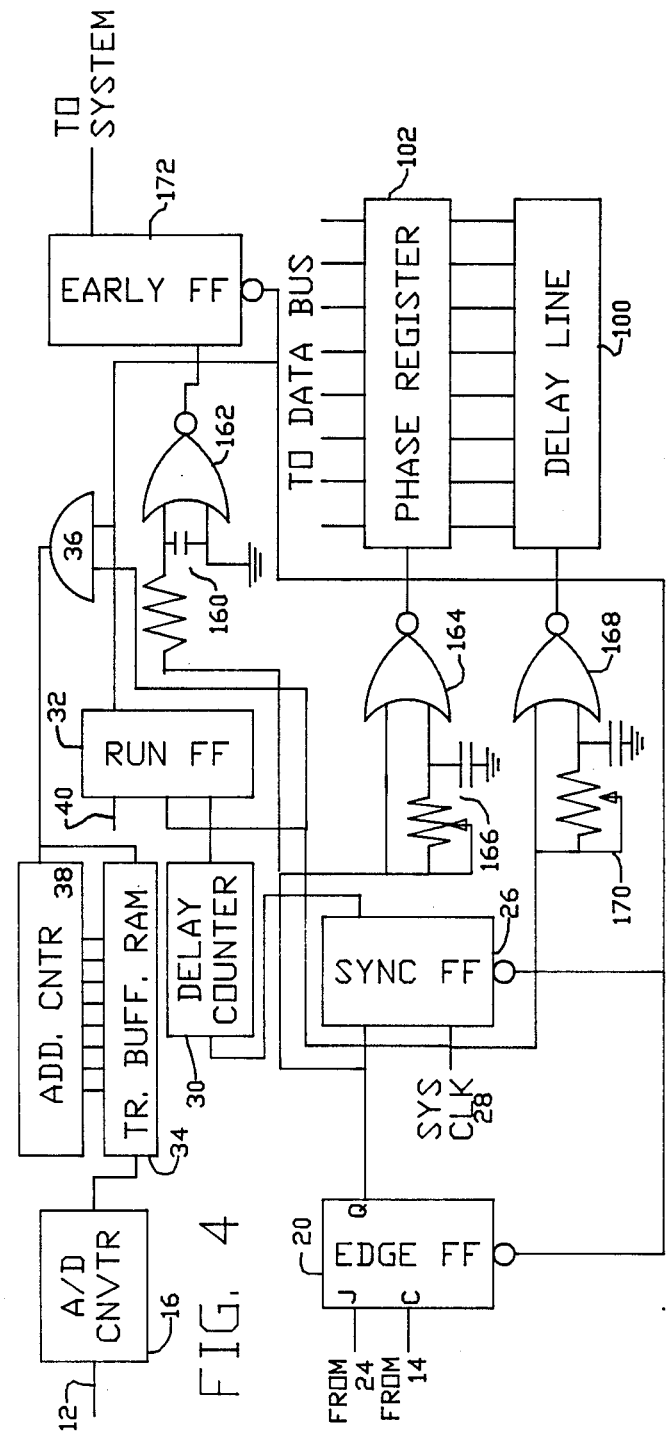

Referring now to FIG. 4, an additional feature of the present invention may be appreciated. Because the boundary between the last phase between a first clock and the first phase of the next clock is critical in some applications, a distortion can result in those applications if the boundary is not correctly placed. The distortion would result in samples being plotted one clock period from their correct location, and can occasionally result unless the phase detector 22 is perfectly aligned with the edge of the clock. To avoid such occasional distortion, the arrangement of FIG. 4 (which has been simplified for clarity) may be used in place of the circuit of FIG. 2. Elements in FIG. 4 which previously appeared in FIG. 1 have been assigned like reference numerals. In essence, the circuit of FIG. 4 provides an "EARLY" flip-flop to detect whether the sample was in an early or late phase. In a sixteen phase system, the EARLY flip-flop determines whether the correct phase of the sample is 0 or 15.

In FIG. 4, the EDGE flip-flop 20 receives the ENABLE TRIGGER signal 24 on the J input, and a signal from the trigger comparator 14 (in FIG. 1) on the clock input. The Q output is then provided to the J input of the SYNC flip-flop 26. The SYNC flip-flop 26 also receives a clocking input from the system clock 28. The EDGE flip-flop 20 and SYNC flip-flop 26 both receive a reset input from the RUN flip-flop 32.

The Q output of the EDGE flip-flop 20 is also provided to an RC circuit 160 at the input of a NOR gate 162, as well as being provided to the input of a second NOR gate 164, including a second RC circuit 166. The system clock 28 also provides the inputs to a two input NOR gate 168, including another RC circuit 170 on one of the inputs.

The Q output of the SYNC flip-flop 26 is provided to the J input of an EARLY flip-flop 172, also of the J-K type. The clock of the EARLY flip-flop 172 is provided by the output of the NOR gate 162. The RC circuit 160 is tuned to provide approximately one-half clock delay, so that the clock of the EARLY flip-flop occurs after the first phase is past, but before the last phase occurs. If the sample occurred during one of the low-numbered phases, the EARLY flip-flop 172 will be set; otherwise, it will not. If the sample is detected as being either a first or last phase, the state of the EARLY flip-flop will be examined. Such examination is conducted by the remainder of the logic of the test device, such as a microprocessor in a digital storage scope. In any event, the state of the EARLY flip-flop will be ignored unless the sample is detected as being in either the first or last phases of the clock.

The function of the RC circuit 166 is to provide delay trim, and the output of the NOR gate 164 provides the clock input to the phase register 102. The function of the RC circuit 170 is to provide fifty-percent duty cycle trim, and the output of the NOR gate 168 drives the delay line 100. As with FIG. 2, the outputs of the Phase Register are provide to the Data Bus for the system. The NOR gates may be 74AS805 type devices.

The output of the RUN flip-flop 32 is again provided to a two-input AND gate 36, which clocks the address counter 38 and trace buffer RAM 34 as discussed in connection with FIG. 1. The A/D converter 16 also supplies data to the trace buffer RAM 34 as described in FIG. 1.

Figure 5:
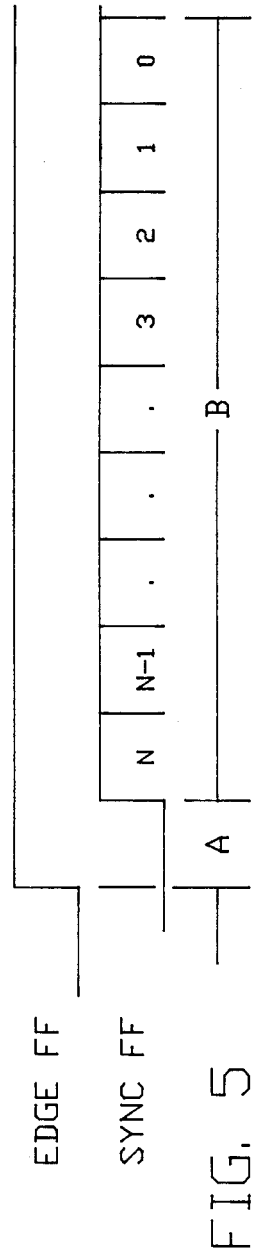

The timing of the operation of the circuit of FIG. 4 may be better appreciated from FIG. 5, in which the output of the EDGE flip-flop 20 is shown above, and the different possible set times of the SYNC flip-flop 26 (for N phases) is shown below. The set-up time and propagation delay of the circuit is shown at A, and the System Clock period is shown at B.

It can thus be appreciated that a simple but effective means and method for determining phase angle between a known reference and a signal under test. In addition, a simple but effect method for ensuring proper assignment of early and late phases is provided for use in those applications, such as digital storage oscilloscopes and logic analyzers, where significant distortion would result if a phase was plotted incorrectly.

Having fully described a preferred embodiment of the invention, it will be apparent to those of ordinary skill in the art, given the foregoing teachings, that numerous alternatives and equivalents exist which do not depart from the invention. As a result, the invention is not to be limited by the foregoing description but only by the appended claims.

What is claimed is:

1. A method of determining relative phase angle between a known reference and a signal under test including the steps of providing a reference signal to a multi-tap delay line, the number of taps being at least equal to the number of phases into which the signal under test is to be resolved, and clocking a parallel shift register by the signal under test to capture the value of each of the delay line taps.

2. A method of determining whether the phase of a sample waveform is in the early or late phases of a clock cycle including the steps of generating an edge trigger signal, developing a synchronizing signal in response to the edge trigger signal and a clock signal, developing a delayed clock signal in response to the edge trigger signal, and developing an early phase signal in response to the synchronizing signal as a data input and the delayed clock signal as a clocking input, wherein the early phase signal may be high or low depending on the state of the synchronizing signal at the time the delayed clock signal changes state.

* * * * *